United States Patent
Kim et al.

(10) Patent No.: US 8,600,766 B2
(45) Date of Patent: Dec. 3, 2013

(54) METHOD AND APPARATUS FOR ENCODING AND DECODING DATA WITH ALTERED BIT SEQUENCE

(75) Inventors: Jung-woo Kim, Seoul (KR); Sung-bum Park, Seongnam-si (KR); Dai-woong Choi, Seoul (KR); Jae-won Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 545 days.

(21) Appl. No.: 12/843,994

(22) Filed: Jul. 27, 2010

(65) Prior Publication Data

US 2011/0026545 A1    Feb. 3, 2011

(30) Foreign Application Priority Data

Jul. 28, 2009  (KR) ................. 10-2009-0068961

(51) Int. Cl.
*G10L 21/00*   (2013.01)
*G10L 19/008*  (2013.01)

(52) U.S. Cl.
CPC .................................. *G10L 19/008* (2013.01)
USPC ........................................................ 704/503

(58) Field of Classification Search
CPC ...................................................... G10L 19/008
USPC ........................................................ 704/504
See application file for complete search history.

(56) References Cited

U.S. PATENT DOCUMENTS

| | | | |
|---|---|---|---|
| 6,061,793 A * | 5/2000 | Tewfik et al. ................. 713/176 |
| 6,307,487 B1 * | 10/2001 | Luby .............................. 714/15 |
| 6,377,930 B1 * | 4/2002 | Chen et al. .................... 704/503 |
| 6,404,931 B1 * | 6/2002 | Chen et al. .................... 382/239 |
| 6,496,794 B1 * | 12/2002 | Kleider et al. ................ 704/201 |
| 6,851,083 B1 * | 2/2005 | Hagenauer et al. ........... 714/774 |
| 7,747,086 B1 * | 6/2010 | Hobbs et al. .................. 382/232 |
| 2008/0063070 A1 * | 3/2008 | Schwartz ................ 375/240.16 |

* cited by examiner

*Primary Examiner* — Steven H Nguyen
*Assistant Examiner* — Phuongchau B Nguyen
(74) *Attorney, Agent, or Firm* — Sughrue Mion, PLLC

(57) ABSTRACT

Provided are methods and apparatuses for encoding data. One method of encoding data includes generating second data by altering locations of bits within first data to be encoded next based on values of bits within at least one piece of previously encoded data; and entropy-encoding the second data. Also provided are methods and apparatuses for decoding data.

18 Claims, 5 Drawing Sheets

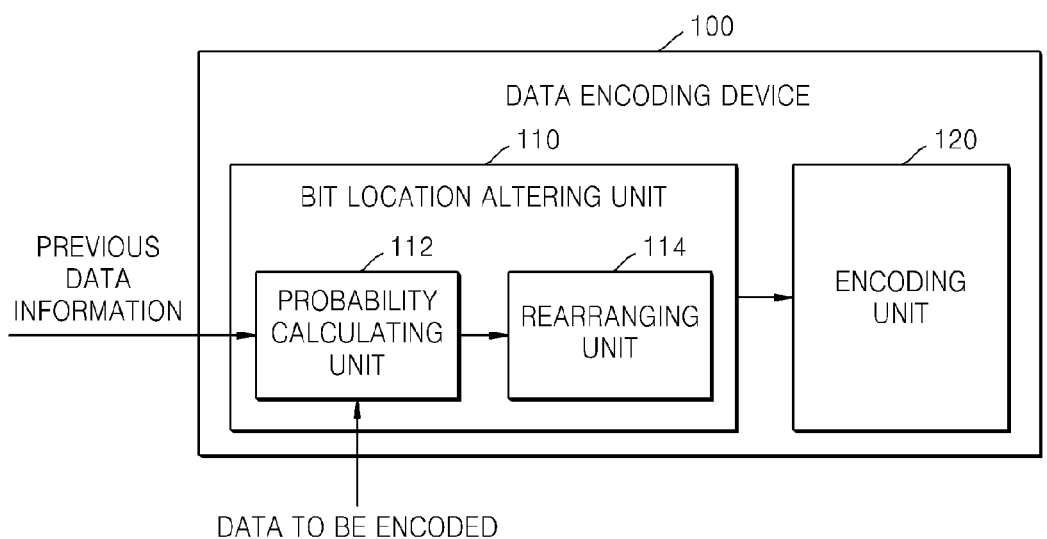

METHOD AND APPARATUS FOR ENCODING AND DECODING DATA WITH ALTERED BIT SEQUENCE

CROSS-REFERENCE TO RELATED APPLICATION

This application claims priority from Korean Application No. 10-2009-0068961, filed on Jul. 28, 2009 in the Korean Intellectual Property Office, the disclosure of which is incorporated herein in its entirety by reference.

BACKGROUND

1. Field of the Invention

Methods and apparatuses consistent with the present invention relate to encoding and decoding data, and more particularly, to a method and an apparatus for encoding and decoding data before and after performing entropy-encoding.

2. Description of the Related Art

Data transmission technologies have continued to develop. A data transmitting device encodes original data and transmits the encoded data, thus ensuring efficient data transmission.

Meanwhile, a data receiving device receives and decodes the encoded data to recover the original data.

If data is encoded prior to transmission, more data may be transmitted via a narrower bandwidth, and thus transmission efficiency is improved. In particular, data should be encoded prior to transmission when large amounts of data, such as image data are transferred.

An example of a data encoding method is the Huffman encoding method. The Huffman encoding method includes searching for coding values corresponding to input data in a Huffman table and outputting those coding values. In this method, coding values to which a small number of bits are allocated correspond to frequently occurring input data for efficient data encoding.

SUMMARY

Aspects of the present invention provide a method of encoding data, the method including generating second data by altering locations of bits within first data to be encoded based on values of bits within at least one piece of previously encoded data; and entropy-encoding the second data.

In accordance with one aspect, generating the second data may include: calculating the probability that each of the bits within the first data has the value '1' based on values of bits within at least one piece of previously encoded data; and rearranging bits within the first data based on the calculated probabilities. For example, the bits may be rearranged such that bits with higher probabilities within the first data are located in lower bits within the second data.

In accordance with one aspect, the probabilities may be calculated based on a number of times that bits have the value '1' at each location within at least one piece of the previously encoded data.

In accordance with one aspect, the entropy-encoding of the second data may include performing at least one of Huffman encoding and Golomb encoding.

According to another aspect, the method of decoding data includes: obtaining first data by entropy-decoding encoded data; and generating second data by altering locations of bits within the first data based on values of bits within at least one piece of data decoded before the first data.

In accordance with one aspect, generating the second data may include: calculating the probability that each of the bits within the first data has the value '1' based on at least one piece of the data decoded before the first data; and rearranging bits within the first data based on the calculated probabilities. For example, the bits may be rearranged such that bits with higher probabilities within the first data are located in lower bits within the second data.

In accordance with one aspect, probabilities may be calculated based on a number of times that bits have the value '1' at each location within at least one piece of the data decoded before the first data.

In accordance with one aspect, entropy-decoding of the second data may include performing at least one of Huffman decoding and Golomb decoding to obtain the first data.

According to another aspect of the present invention, an apparatus for encoding data includes: a bit location altering unit that generates second data by altering locations of bits within the next first data to be encoded based on values of bits within at least one piece of previously encoded data; and a data encoding unit that entropy-encodes the second data.

According to another aspect of the present invention, an apparatus for decoding data includes: a decoding unit that obtains first data by entropy-decoding encoded data; and a bit location altering unit that generates second data by altering locations of bits within the first data based on values of bits within at least one piece of data decoded before the first data.

BRIEF DESCRIPTION OF THE DRAWINGS

The above and other aspects of the present invention will become more apparent by describing in detail exemplary embodiments thereof with reference to the attached drawings in which:

FIG. 1 is a block diagram of a data encoding device according to an exemplary embodiment of the present invention;

FIG. 2 shows an example of calculating probabilities using the probability calculating unit of FIG. 1;

DETAILED DESCRIPTION OF EXEMPLARY EMBODIMENTS

Figure 3:
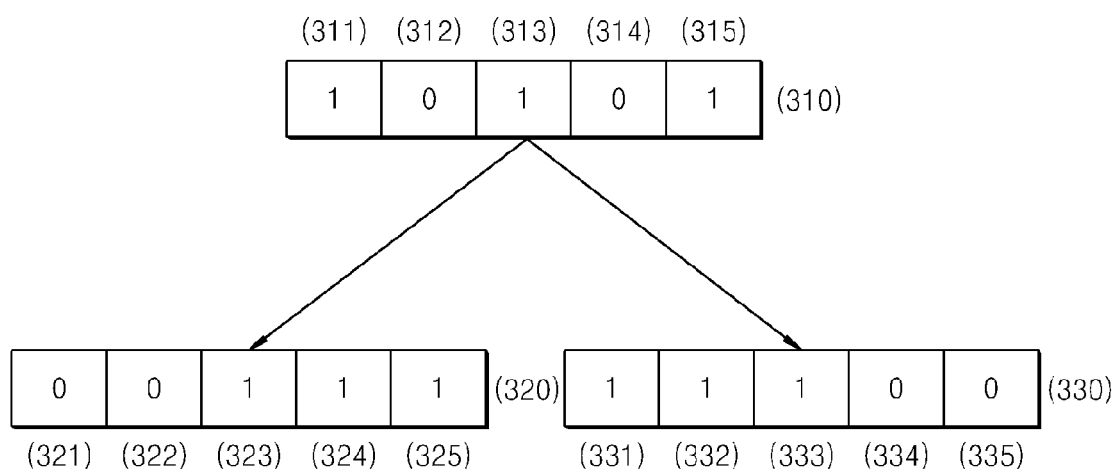
FIG. 3 shows an example of rearranging bits based on the probabilities determined in FIG. 2.

Hereinafter, exemplary embodiments will be described with reference to the attached drawings.

FIG. 1 is a block diagram of a data encoding device 100 according to an exemplary embodiment of the present invention.

In one exemplary embodiment, the data encoding device 100 includes a bit location altering unit 110 and an encoding unit 120.

The bit location altering unit 110 generates second data by altering locations of bits within first data that is next to be encoded. Here, the bit location altering unit 110 uses information regarding at least one piece of previously encoded data. For example, the bit location altering unit 110 alters the sequence of bits within the first data based on values of bits in at least one piece of previously encoded data.

One of ordinary skill in the art will understand that the bit location altering unit 110 may use different ways to alter locations of bits within first data.

In one exemplary embodiment, the bit location altering unit 110 may include a probability calculating unit 112 and a rearranging unit 114.

The probability calculating unit 112 calculates probabilities that each of the bits within the first data has the value '1' based on at least one piece of previously encoded data.

However, the probability calculating unit 112 may calculate probabilities that each of the bits within the first data has the value '0' based on at least one piece of previously encoded data.

The probability calculating unit 112 may perform the probability calculation in various ways. Although three (3) methods for calculating the probabilities are described below, the present invention is not limited thereto. These three (3) methods are also applicable to the decoding probability calculation units.

According to a first exemplary method, it is assumed that a value of a bit at a location which frequently has a value of '1' in previous data, is likely to be '1'. According to the method, a bit at a location that most frequently has a value of '1' within the previous data is considered most likely to have the value '1.'

The probability calculating unit 112 calculates the number of times that bits had the value '1' at each location within previous data, and calculates the probability that each bit within the first data would have the value '1' based on this calculation.

According to a second exemplary method, it is assumed that a value of a bit at a location that frequently has a value of '1' within previous data is likely to be '1,' but probabilities that bits within the first data have the value '1' are calculated in consideration of additional conditions.

For example, one condition is the amount of time that has passed since a location has had a value of '1'. That is, even if the number of times that bits have the value '1' at two locations within the previous data is the same, the location where a bit has the value '1' more recently is considered more likely to have the value '1.'

In another exemplary embodiment, it is assumed that a bit at a location where previous bits had a value of '1' successively for a predetermined number of times, is less likely to have the value '1' next time. Even if the number of times that bits have a value of '1' at two locations within the previous data is the same, the location where values of bits were '1' successively for a predetermined number of times, is considered less likely to have the value '1' next time.

According to a third exemplary method, probabilities that bits within the first data have the value '1' may be calculated by analyzing a trend of values of bits being altered within previous data.

In one exemplary embodiment, the rearranging unit 114 rearranges bits within the first data based on calculated probabilities. Here, the rearranging unit 114 alters the bits within the first data such that encoding may be efficiently performed.

Decimal number system is a positional system of numeration that uses decimal digits and a base of ten. And that is frequently used in mathematics for writing numbers and performing arithmetic.

For example, if the encoding unit 120 uses an encoding method in which encoding efficiency increases as a decimal value of input data decreases, the rearranging unit 114 may alter locations of bits such that a bit that is more likely to have the value '1' in the first data, is located in lower bits within the second data. Thus, bits at a location where most bits have a value of '1' within the first data will be located at the lowest bits within the second data.

On the contrary, if the encoding unit 120 uses an encoding method in which encoding efficiency increases when a decimal value of input data increases, the rearranging unit 114 may alter locations of bits such that a bit that is more likely to have the value '1' in the first data, is located in upper bits within the second data. Thus, bits at a location where most bits have a value of '1' within the first data will be located at the highest bits within the second data.

In one exemplary embodiment, the encoding unit 120 encodes the second data. The encoding unit 120 may entropy-encode the second data. Entropy-encoding is an encoding method that alters the lengths of codes according to probabilities that encoded data is input, wherein frequently occurring data is encoded to shorter codes for improved encoding efficiency. Examples of entropy-encoding methods include, but are not limited to, the Huffman encoding method and the Golomb encoding method.

FIG. 2 shows an example of calculating probabilities using the probability calculating unit 112.

In FIG. 2, the probability calculating unit 112 uses information regarding five pieces of data 210 through 250 that have been encoded before first data 260. The calculation is performed under an assumption that a value of a bit at a location where bits frequently have a value of '1' within previous data is likely to be '1.'

The probability calculating unit 112 calculates a number of bits having the value '1' at each location within the pieces of data 210 through 250. Referring to FIG. 2, throughout the pieces of data 210 through 250, there are five (5) first bits having the value '1', two (2) second bits having the value '1', three (3) third bits, one (1) fourth bit, and four (4) fifth bits.

As shown in FIG. 2, the frequency of bits having the value '1' in the data 210 through 250 decreases in the order following: the first bits, the fifth bits, the third bits, the second bits, and the fourth bits. Thus, the probability calculating unit 112 determines that the probabilities for bits of the first data 260 to have the value '1', in order from highest to lowest probability, is: first bit 261, fifth bit 265, third bit 263, second bit 262, and fourth bit 264.

FIG. 3 shows an example rearranging bits based on the probabilities determined in FIG. 2.

In the case where encoding efficiency increases when a decimal value of input data decreases, the rearranging unit 114 rearranges bits such that bits more likely to have the value '1' within first data 310 are located in lower bits within second data 320.

As described with reference to FIG. 2, the frequency of bits having the value '1' in the data 210 through 250 is in the order of first bit, fifth bit, third bit, second bit, and fourth bit within the first data. Thus, the first bit 311 within the first data 310 is rearranged at a fifth bit 325 within the second data 320, the second bit 312 within the first data 310 remains in the second position at a second bit 322 within the remains in the third position at second data 320, and the third bit 313 within the first data 310 remains in the third position at a third bit 323 within the second data 320. In this regard, the fourth bit 314 within the first data 310 is rearranged at a first bit 321 within the second data 320, and the fifth bit 315 within the first data 310 is rearranged at a fourth bit 324 within the second data 320.

According to an exemplary embodiment of the method described above, the second data 320 having the value '00111' may be obtained by altering locations of bits within the first data 310 having the value '10101.'

In another exemplary embodiment, where encoding efficiency increases when a decimal value of input data increases, the rearranging unit 114 rearranges bits such that bits more likely to have the value '1' within first data 310 are located in upper bits within second data 330. Thus, the first bit 311 within the first data 310 remains at a first bit 331 within the second data 330, the second bit 312 within the first data 310 is rearranged at a fourth bit 324 within the second data 330, and the third bit 313 within the first data 310 remains at a third bit 333 within the second data 330. In this regard, the fourth bit 314 within the first data 310 is rearranged at a fifth bit 335 within the second data 330, and the fifth bit 315 within the first data 310 is rearranged at a second bit 332 within the second data 330.

According to the method described above, the second data 330 having the value '11100' may be obtained by altering locations of bits within the first data 310 having the value '10101.'

The rearranging unit 114 only rearranges a sequence of bits within the first data 310. Thus, the first data 310 and the second data 320 of an exemplary embodiment or the second data 330 of another exemplary embodiment have the same number of bits having the value '1' and also have the same data length.

Figure 4A:
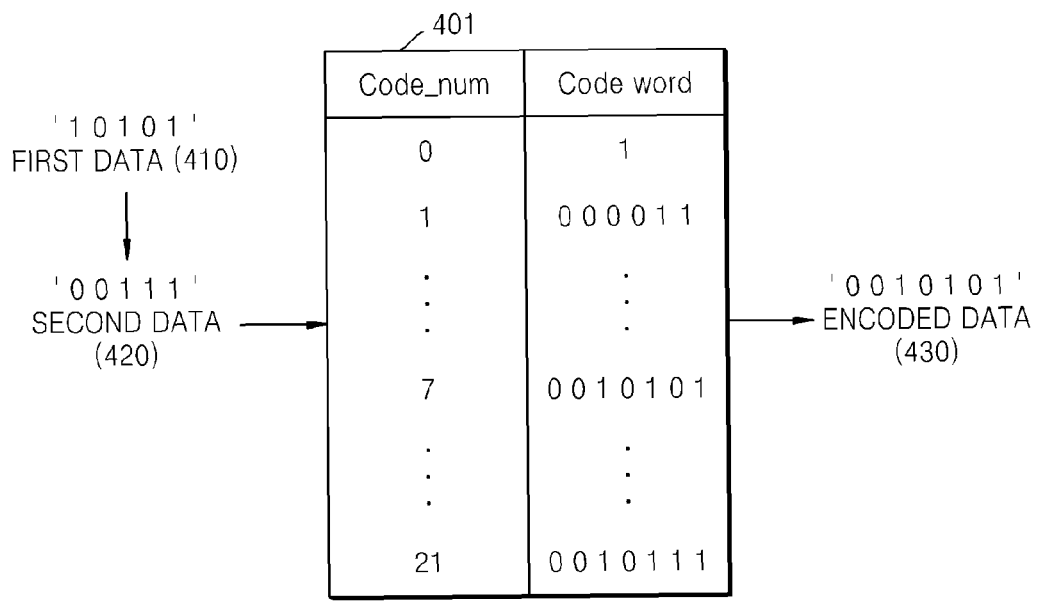
FIG. 4A is a diagram illustrating a method of encoding second data using a Huffman table, according to an exemplary embodiment of the present invention.

FIG. 4A is a diagram showing a method encoding second data using a Huffman table, according to an exemplary embodiment of the present invention.

In FIG. 4A, a Huffman table 401 is designed such that data length increases when a decimal value of data to be encoded increases. In one exemplary embodiment, the Huffman table 401 as shown in FIG. 4A is used in the case where data having relatively small decimal values are frequently input.

In the Huffman table 401, 'Code-num' is a decimal value of data to be encoded, and 'Code word' is encoded data. In FIG. 4A, it is assumed that the value of first data 410 is '10101,' and second data 420 is generated by altering locations of bits within the first data 410. In FIG. 4A, the value of the second data 420 is '00111.'

The decimal value of '00111' is '7.' The decimal value '7' is mapped to '0010101' in the Huffman table 401. Thus, the value of encoded data 430 is '0010101.'

A method of encoding the first data 410 without altering locations of bits within the first data 410 will be described below. The decimal value of '10101' is '21.' The decimal value '21' is mapped to '0010111' in the Huffman table 401. Thus, the value of encoded data is '0010111.'

Figure 4B:
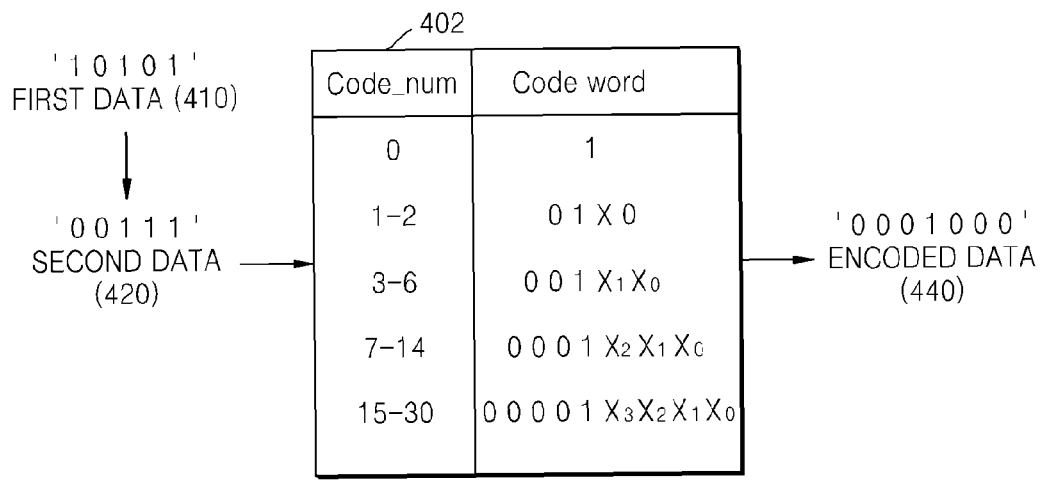
FIG. 4B is a diagram illustrating a method of encoding second data using a Golomb table, according to an exemplary embodiment of the present invention.

FIG. 4B is a diagram showing a method of encoding second data using a Golomb table 402, according to an exemplary embodiment of the present invention. In FIG. 4B, the Golomb table 402 is designed such that data length increases when a decimal value of data to be encoded is relatively great. In FIG. 4B, it is assumed that the value of the first data 410 is '10101,' and the value of the second data 420 is '00111.'

The decimal value of '00111' is '7.' The decimal value '7' is mapped to '0001000' in the Golomb table 402. Thus, the value of encoded data 440 is '0001000.'

A method of encoding the first data 410 without altering locations of bits within the first data 410 will be described below. The decimal value of '10101' is '21.' The decimal value '21' is mapped to '000010110' in the Golomb table 402. Thus, the value of the encoded data 440 is '000010110.'

In related art encoding methods, data to be encoded and encoded data are mapped to each other on a one-to-one basis. Thus, it is difficult to improve encoding efficiency indefinitely. However, in the data encoding device 100 according to an exemplary embodiment of the present invention, data to be encoded and encoded data may be mapped to each other on a one-to-many basis. In other words, the data encoding device 100 according to one exemplary embodiment of the present invention may convert different first data to the same second data if the first data includes the same number of bits having the value '1'. Thus, encoding efficiency may be significantly improved.

For example, according to a related art method of encoding data by using the Huffman table 401, data corresponding to the value '00001' should be input such that the value of encoded data is '000011.' However, the data encoding device 100 according to an exemplary embodiment of the present invention alters locations of bits within data before the data is input to the encoding unit 120. Thus, the value of encoded data may be '000011' not only when data corresponding to '00001' is input, but also when data corresponding to '00010,' 00100,' 01000,' or '10000' is input. Therefore, encoding efficiency may be significantly improved.

Figure 5:
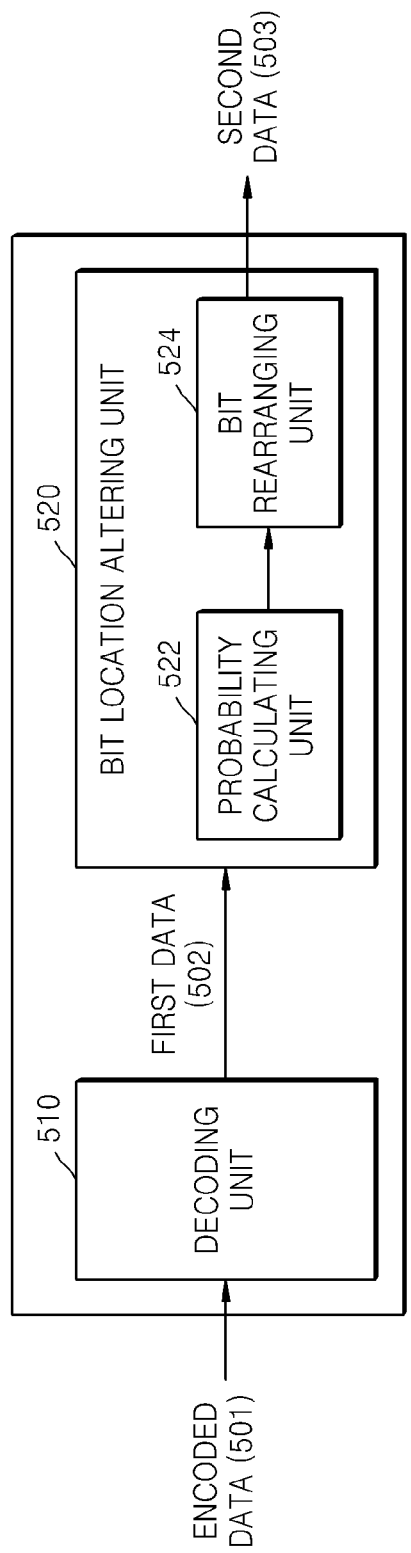
FIG. 5 is a block diagram illustrating a data decoding device according to an exemplary embodiment of the present invention.

FIG. 5 is a block diagram of a data decoding device 500 according to an exemplary embodiment of the present invention.

In this exemplary embodiment, the data decoding device 500 includes a decoding unit 510 and a bit location altering unit 520.

The decoding unit 510 obtains first data 502 by decoding encoded data 501. Second data 503 is data prior to entropy-encoding, and the first data 502 is data obtained by altering locations of bits within the second data 503.

The decoding unit 510 decodes data by using a decoding method corresponding to an encoding method used by the encoding unit 120. Various decoding methods may be used by the decoding unit 510, including entropy-decoding methods such as the Golomb decoding method and the Huffman decoding method.

The bit location altering unit 520 generates the second data 503 by altering locations of bits within the first data 502. Here, the bit location altering unit 520 generates the second data 503 by altering locations of bits within the first data 502 based on values of bits within at least one piece of previously decoded data.

The bit location altering unit 520 may include a probability calculating unit 522 and a bit rearranging unit 524. The probability calculating unit 522 calculates the probability that each of the bits within the second data 503 has the value '1' based on at least one previously decoded data.

The probability calculating unit 522 may perform the probability calculation in various ways. For example, the probability calculating unit 522 may calculate the number of times that bits have the value '1' at each of the locations within previously decoded data wherein the location of bits having the largest number of values of '1' within the previously decoded data would most likely to have the value '1.' Alternatively, various methods, such as, for example, giving greater weight to values of bits within data decoded right before current data to be decoded or analyzing trends within previous data, may be used.

In one exemplary embodiment, the bit rearranging unit 524 rearranges bits based on probabilities. For example, the bit rearranging unit 524 rearranges bits such that lower bits within the first data 502 are located in bits having higher probabilities within the second data 503.

In one example, the value of the first data 502 is '00111.' Furthermore, it is assumed that the probability calculating unit 522 has determined that the probabilities for bits of the second data 503 to have a value of '1', in the order of highest to lowest probability, to be: first bit, fifth bit, third bit, second bit, and fourth bit.

Since the first bit within the second data 503 is the most likely to have the value '1,' the last bit of the first data 502 is located at the first bit of the second data 503. Furthermore, since the fifth bit within the second data 503 is the second most likely to have the value '1,' the fourth bit of the first data 502 is located at the fifth bit of the second data 503. In this way, bits within the first data 502 are rearranged. As a result, the value of the second data 503 is '10101.'

Figure 6:
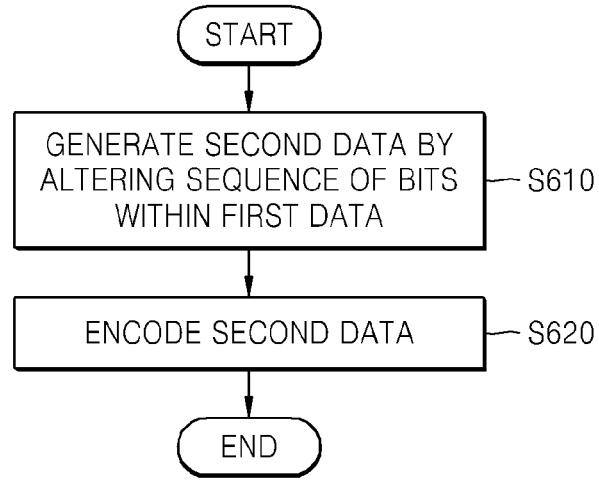
FIG. 6 is a flowchart of a method of encoding data according to an exemplary embodiment of the present invention.

FIG. 6 is a flowchart of a method of encoding data according to an embodiment of the present invention.

In operation S610, second data is generated by altering locations of bits within first data to be encoded next based on values of bits within at least one piece of previously encoded data.

In operation S620, the second data is entropy-encoded.

Figure 7:
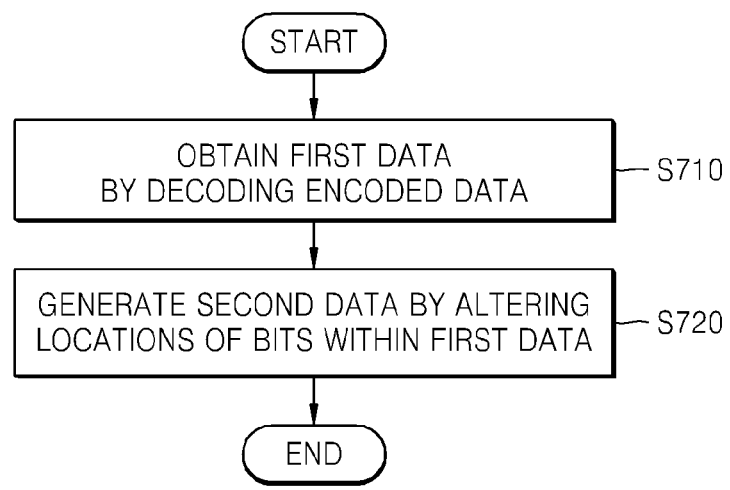
FIG. 7 is a flowchart of a method of decoding data according to an exemplary embodiment of the present invention.

FIG. 7 is a flowchart of a method of decoding data according to an embodiment of the present invention.

In operation S710, first data is obtained by entropy-decoding encoded data.

In operation S710, second data is generated by altering locations of bits within first data based on values of bits within at least one piece of previously decoded data.

Exemplary embodiments of the present invention can be written as computer programs and can be implemented in general-use digital computers that execute the programs using a computer readable recording medium. Examples of the computer readable recording medium include magnetic storage media (e.g., read only memory (ROM), floppy disks, hard disks, etc.) and optical recording media (e.g., compact disc-ROMs (CD-ROMs), or digital video discs (DVDs).

While this invention has been particularly shown and described with reference to exemplary embodiments thereof, it will be understood by those of ordinary skill in the art that various changes in form and details may be made therein without departing from the spirit and scope of the invention as defined by the appended claims and their equivalents. The exemplary embodiments should be considered in a descriptive sense only and not for purposes of limitation.

What is claimed is:

1. A method of encoding data, the method comprising:
generating second data by altering locations of bits within first data to be encoded based on previously encoded data; and
entropy-encoding the second data,
wherein the generating of the second data comprises:
for each bit within the first data, calculating a probability that the bit has a predetermined value based on values of bits within previously encoded data; and
rearranging bits within the first data based on the calculated probabilities.

2. The method of claim 1, wherein the predetermined value is a value of '1.'

3. The method of claim 1, wherein the predetermined value is a value of '0.'

4. The method of claim 1, wherein the bits are rearranged such that bits with higher probabilities within the first data are located in lower bits within the second data.

5. The method of claim 1, wherein the bits are rearranged such that bits with higher probabilities within the first data are located in higher bits within the second data.

6. The method of claim 1, wherein the probability is calculated based on a number of times that a bit has the predetermined value at the same location within at least one piece of the previously encoded data.

7. The method of claim 1, wherein the entropy-encoding of the second data comprises encoding the second data by performing at least one of Huffman encoding and Golomb encoding.

8. A non-transitory computer readable recording medium having recorded thereon a computer program for implementing the method of claim 1.

9. A method of decoding data, the method comprising:
obtaining first data by decoding encoded data; and
generating second data by altering locations of bits within first data based on previously decoded data,
wherein the generating of the second data comprises:
for each bit within the first data, calculating a probability that the bit has a predetermined value based on values of bits within the previously decoded data; and rearranging bits within the first data based on the calculated probabilities.

10. The method of claim 9, wherein the predetermined value is a value of '1.'

11. The method of claim 9, wherein the predetermined value is a value of '0.'

12. The method of claim 9, wherein the bits are rearranged such that bits with higher probabilities within the first data are located in lower bits within the second data.

13. The method of claim 9, wherein the bits are rearranged such that bits with higher probabilities within the first data are located in higher bits within the second data.

14. The method of claim 9, wherein the probability is calculated based on a number of times that a bit has the predetermined value at of the same location within at least one piece of the previously decoded data.

15. The method of claim 9, wherein the entropy-decoding of the encoded data to obtain the first data comprises performing at least one of Huffman decoding and Golomb decoding.

16. A non-transitory computer readable recording medium having recorded thereon a computer program for implementing the method of claim 9.

17. An apparatus for encoding data, the apparatus comprising:
a bit location altering unit which generates second data by altering locations of bits within first data to be encoded based on previously encoded data; and
a data encoding unit which encodes the second data,
wherein the bit altering unit comprises:
a probability calculating unit which, for each bit within the first data, calculates a probability that the bit has a predetermined value based on values of bits within previously encoded data; and
a rearranging unit that rearranges bits within the first data based on the calculated probabilities.

18. An apparatus for decoding data, the apparatus comprising:
a decoding unit which obtains first data by decoding encoded data; and
a bit location altering unit which generates second data by altering locations of bits within first data based on previously decoded data,
wherein the bit location altering unit comprises:

a probability calculation unit which, for each bit within the first data, calculates a probability that the bit has predetermined values based on values, of bits within the previously decoded data, and a bit rearranging unit that rearranges bits within the first data based on the calculated probabilities.

* * * * *